(12) United States Patent
Serebryanskiy

(10) Patent No.: US 10,972,114 B1
(45) Date of Patent: Apr. 6, 2021

(54) REAL-TIME WAVEFORMS AVERAGING WITH CONTROLLED DELAYS

(71) Applicant: Guzik Technical Enterprises, Mountain View, CA (US)

(72) Inventor: Valeriy Serebryanskiy, Santa Clara, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/859,227

(22) Filed: Apr. 27, 2020

Related U.S. Application Data

(60) Provisional application No. 62/944,510, filed on Dec. 6, 2019.

(51) Int. Cl.
*H03M 1/06* (2006.01)

(52) U.S. Cl.
CPC .............................. *H03M 1/0634* (2013.01)

(58) Field of Classification Search
CPC .................................................. H03M 1/0634
USPC .................................................. 341/118–155
See application file for complete search history.

(56) References Cited

U.S. PATENT DOCUMENTS

| | | | |
|---|---|---|---|
| 7,250,886 B1* | 7/2007 | Killat | H03K 17/0416 341/143 |
| 10,346,339 B2 | 7/2019 | Spehar et al. | |
| 2012/0194369 A1* | 8/2012 | Galton | H03M 3/388 341/120 |
| 2018/0262313 A1* | 9/2018 | Nam | H04L 5/005 |
| 2019/0149383 A1* | 5/2019 | Ko | H04W 72/04 370/329 |

* cited by examiner

*Primary Examiner* — Lam T Mai
(74) *Attorney, Agent, or Firm* — Burns & Levinson, LLP; Joseph M. Maraia

(57) ABSTRACT

Repetitive waveforms are processed to produce an averaged replica of the waveforms by first determining a stream of digital samples, with random time shifts of waveform starts relative to the samples. A mutual arrangement of a trigger signal and a following sample over a succession of sampling periods, enables k sections coinciding with segments [k·T/K, (k+1)·T/K]. K is determined and a distance D between the trigger signal and the following sample is calculated. Second, values of the samples are transformed so that waveforms represented by the samples, are shifted in time by D in relation to the sample positions. The mutual positions of the delayed waveforms and the sampling clock along multiple axes, exactly repeats so that values of the produced samples along the axes coincide. The discreet time delays before averaging avoid frequency component distortions in resulting replicas of the waveforms.

3 Claims, 6 Drawing Sheets

US 10,972,114 B1

REAL-TIME WAVEFORMS AVERAGING WITH CONTROLLED DELAYS

CROSS REFERENCE TO RELATED APPLICATIONS

This application claims priority to and the benefit of U.S. Provisional Patent Application No. 62/944,510, filed on Dec. 6, 2019 and titled "REAL-TIME WAVEFORMS AVERAGING WITH CONTROLLED DELAYS", the contents of which are incorporated herein by reference as though fully set forth herein.

TECHNICAL FIELD

The present disclosure relates to high speed analog-to-digital converters (ADC) and, more particularly, to improvement of converter accuracy by digital waveforms averaging.

BACKGROUND

Digital averaging is used as a method of repetitive waveforms detection and/or measurement in low signal-to-noise ratio (SNR) environments typical for high speed digitizers and digital oscilloscopes. Digital averaging is also used in wide bandwidth radio frequency communications, radar, signal processing, scientific research and other applications.

Digital waveform averaging improves signal to noise ratio proportionally to a square root of a number of averages. Depending on a required SNR, a large number of averaging cycles may be required (e.g., $10^6$ averages can result in 60 dB SNR improvement). A block diagram of a conventional device 10 for repetitive waveforms averaging is shown in FIG. 1.

In the block diagram of FIG. 1, a sequence of the analog repetitive waveforms is applied to a signal input 10A of device 10. An analog to digital converter (ADC) 12 transforms this analog waveforms sequence into stream of digital samples. The start of each applied waveform in the applied sequence is identified and marked by a trigger signal coming from an external device through a trigger input 10B. The trigger signal actuates an address counter 14, which is advanced by a sampling clock source applied by way of a clock input 10C. In this way, the address counter 14 "counts" the samples produced by ADC 12. During each sampling period, the address counter 14 forms at an output, a serial number of a sample in the representation of a "current" waveform.

In addition to ADC 12 and address counter 14, device 10 comprises an accumulator 16 (typically in the form of a memory unit having a signal input 16A, a control read/write input 16B and an address input 16C) and a register 18. The read/write (R/W) input 16B receives the sampling clock signal, so that in the first half of a sampling interval, the accumulator 16 is in a "read" mode, while in the second half of that sampling interval the accumulator 16 is in a "write" mode. The number at the address input 16C of the accumulator 16 equals the number produced by the address counter 14, which shows the serial number of the current sample. An output 16D of the accumulator 16 is connected to a signal input 18C of the register 18, while the clock input 18A receives the sampling clock. A falling edge of the sampling clock writes into the register 18 by way of an input 18A, an amount/value which has been read from the accumulator (memory) 16 in the previous half of sampling period (it is the amount/value which has been saved in a memory cell of accumulator 16 with the number equal to the number of the then-current sample). That amount/value appears at an output 18B of register 18 and is applied to a first input 19A of the adder 19. The adder 19 adds this value to a then-current sample value, applied from an output of ADC 12 to its second input 19B. Since in the second half of the sampling interval, the accumulator 16 is in a writing mode, the sum is written into the memory cell of accumulator (memory) 16 with a number equal to the number of the current sample. In this way, the samples representing the current waveform of the applied sequence are added to the contents of the accumulator 16.

After the number of the waveforms, saved in the accumulator reaches a specified value, the accumulated sum is read from the memory of accumulator 16, producing at the accumulator output 16D, the result of waveforms averaging. In this manner, the problem of repetitive waveforms averaging becomes solved, however the procedure, which has been described, has a serious disadvantage.

In particular, the stream of waveforms at the signal input 10A and the sampling clock 10C, are unbound; that is, those signals are asynchronous. The start of a waveform may appear at any arbitrary point inside a sampling interval. The distance between the instant of the waveform start (i.e., the instant of trigger signal appearance) and the next sample is a random variable which lies in a range from zero to T, where T is the sampling period. As a consequence, the assembly of samples, representing a waveform, is shifted in time in relation to the waveform start by this random value.

The mutual disposition of the ADC samples and the trigger signal, with indication of the sampling interval and the delay of the samples assembly from waveform start, is shown in FIG. 2. If i is the number of a waveform $f_i(t)$ and $\varepsilon_i$ is the time displacement of samples relative to the start of the waveform which they represent, then the average of N waveforms is:

$$\langle f(t) \rangle = \frac{1}{N} \sum_{i=1}^{N} f(t - \varepsilon_i).$$

A Fourier transform of an averaged signal equals the average of Fourier transforms of the individual waveforms. A reasonably close approximation of the statistics of the time displacements $\varepsilon_i$ is obtained by a uniform distribution within the interval [0,T], where T is the sampling period. The Fourier transform of a uniform distribution (characteristic function) has a frequency response given by:

$$\langle F(\omega) \rangle = F(\omega) \frac{\sin(\omega T / 2)}{\omega T / 2}. \tag{1}$$

This frequency response is shown in FIG. 3 for a signal frequency normalized to Nyquist frequency. For example, use of a 32 GSa/s ADC results in 2.2 dB attenuation of 12 GHz signal after averaging.

FIG. 4 illustrates the impact of time shift of the trigger signal relative to the ADC sampling clock on the waveforms averaging. A Linear Frequency Modulated (LFM) pulse having 7 ns duration and frequency range from 1 GHz to 12 GHz, is shown in part (a) of FIG. 4. That signal has uniform 1V amplitude. Part (b) of FIG. 4 demonstrates result of 10,000 waveforms averaging with random digital trigger position relative to ADC sampling clock of 32 GSa/s. As may be seen, the averaged signal is distorted, with increasing attenuation toward the pulse end, corresponding to higher frequencies.

It is convenient to estimate the degree of distortions due to the time shift of the trigger signal relative to the ADC sampling clock by attenuation $b_N$ at the Nyquist frequency $\omega_N=\pi/T$, where this attenuation is the greatest. Calculation according the equation (1) shows that $b_N$=3.92.

Equation (1) and FIG. 3 show that the spectrum of the averaged signal $$<F(\omega)>$$

differs from the real spectrum $F(\omega)$ of the unshifted waveform $f(t)$: the high frequency components of the averaged signal are suppressed, as compared to the low frequency components. In a number of applications, such frequency components distortions of the processed signal prevent the use of averaging for noise suppression or, at least, reduce the efficiency of such a suppression. For this reason, serious efforts are made in practice, to reduce the frequency components distortions which appear during averaging of a stream of repetitive waveforms.

A method and apparatus for improving the accuracy of measurement instruments by minimizing effects, such as higher frequency components attenuation in the process of increasing signal to noise ratio through averaging repetitive waveforms, were proposed in U.S. Pat. No. 10,346,339. According to that patent, the phase of the averaged signal $<f(t)>$ is computed by performing a Fast Fourier Transform (FFT). In a similar way, phases of the individual waveforms are calculated and then phase differences between each individual waveform, and the phase of the averaged signal, are determined. The phase differences are used to find time shifts $\varepsilon_i$ for each waveform. To compensate the encountered time shifts, the result of the FFT, which was performed on each individual waveform, is multiplied by $\exp(j\cdot 2\pi\cdot f\cdot \varepsilon_i)$. The compensated FFT results are averaged and converted to the time domain, in order to obtain averaged time domain result.

The method and apparatus of the U.S. patent Ser. No. 10/346,339 (the "'339 patent") provide for an accurate correction of frequency distortions, which appear during averaging of a sequence of repetitive waveforms. However, the necessity to perform a pair of direct and inverse FFTs of each waveform (which may be done only at the sampling frequency of the ADC) requires a great quantity of computing recourses, which, in turn, prevents real time realization of the proposed approach. Another serious disadvantage of the proposed method and apparatus of the '339 patent, consists of the use of the concept of signal phase. This concept is applicable to signals with high signal to noise ratio only. It is impossible to speak about phase of an arbitrary signal in the presence of noise higher than signal. This fact significantly narrows the possible areas of application of the proposed problem solution of the '339 patent.

The goal of the present disclosure is to provide a method and apparatus of noise suppression by averaging a sequence of repetitive waveforms with correction of frequency distortions, caused by the time shift of the trigger signal and waveforms starts in relation to the sampling clock, thereby establishing a real time realization and processing of all kinds of signals.

DETAILED DESCRIPTION

The purpose of processing a signal containing repetitive waveforms, is to produce an averaged replica of the waveforms. The processing begins by conversion of an initial analog signal into a stream of digital samples. In general, the appearance of repetitive waveforms to be averaged happens independently of the conversion operation. As a consequence, there is a random time shift of starts of waveforms in relation to streams of samples of those waveforms. As noted above, time shift of starts of waveforms in relation to a sampling clock causes frequency components distortions of the averaged replica, which suppress its high frequency components. According to the present disclosure, to prevent the distortion of the averaged replica, a stream of samples representing the initial applied signal to be processed, is subjected to an operation of controlled discreet time delay.

When a next waveform appears in an initial applied repetitive signal, the first step of the controlled discreet time delay operation is performed. At this step, a mutual arrangement of a trigger signal (which marks the start of a waveform) and the following sample is analyzed. The sampling period T of the sampling signal, is divided into K uniform sections so that a section with the number k coincides with the segment $[k\cdot T/K, (k+1)\cdot T/K]$. The number k ($0 \leq k < K$) of the section, where the trigger signal has appeared, is determined and the approximate distance D between the trigger signal and the following sample is calculated with the use of the equation $D=(K-1-k)\cdot T/K$.

At the second step of the operation, the values of the samples are transformed in such a way that the waveform represented by these samples, is shifted in time in relation to the position of the samples themselves, by an amount equal to D.

Figure 1:
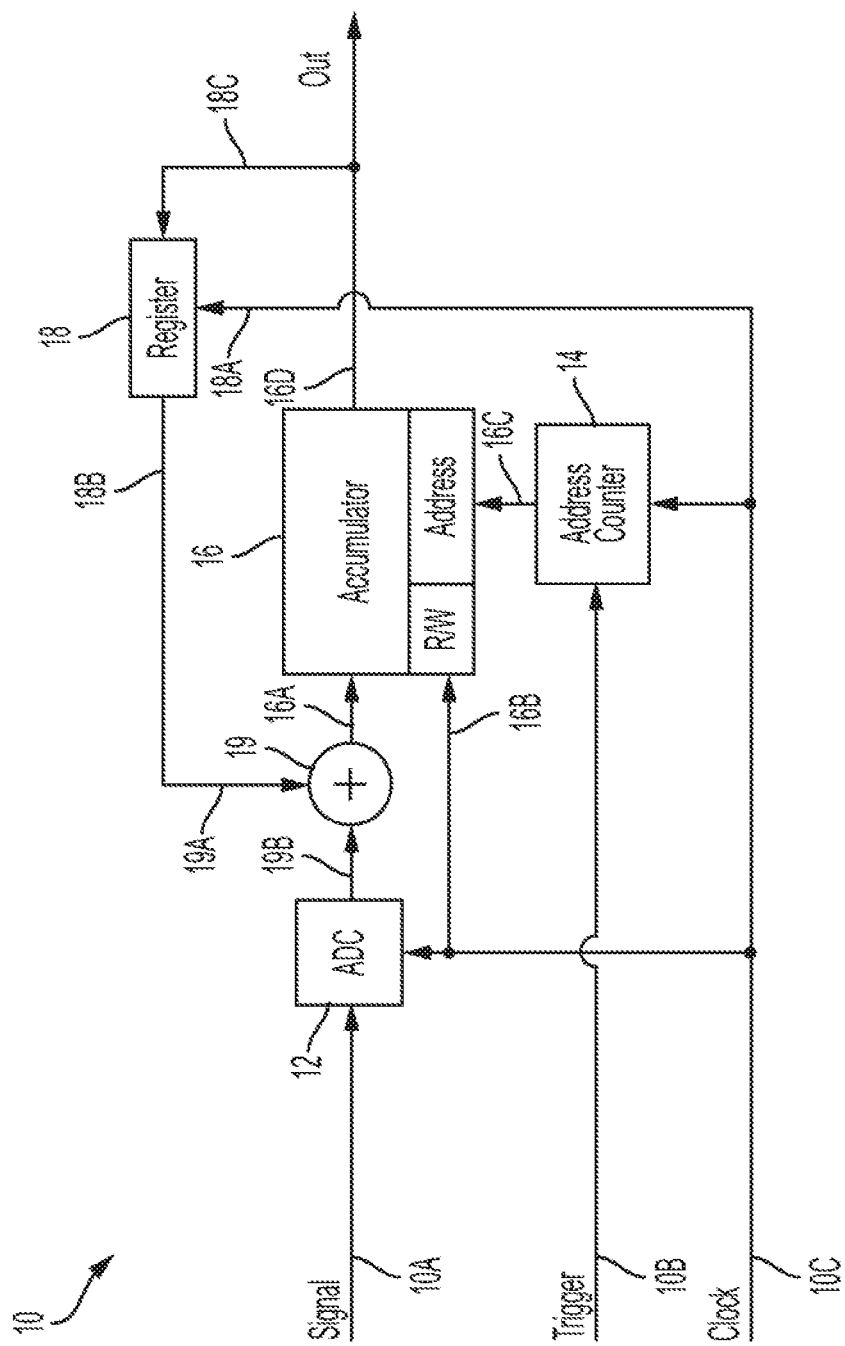
FIG. 1 depicts a block diagram of prior art waveforms averaging.
Figure 2:
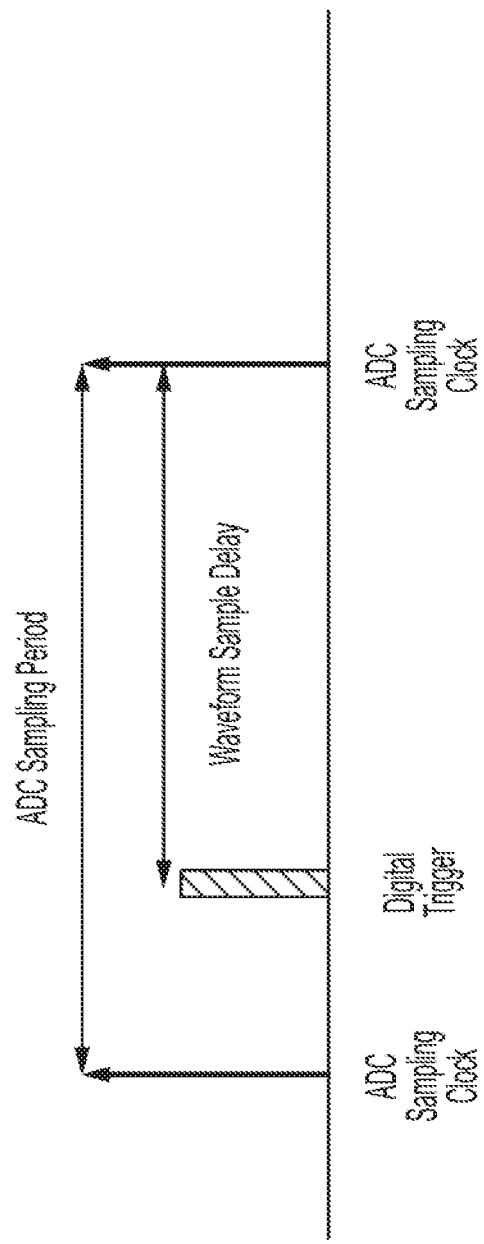
FIG. 2 shows a timing diagram, illustrating relative disposition of a trigger signal and an ADC sampling clock period.
Figure 3:
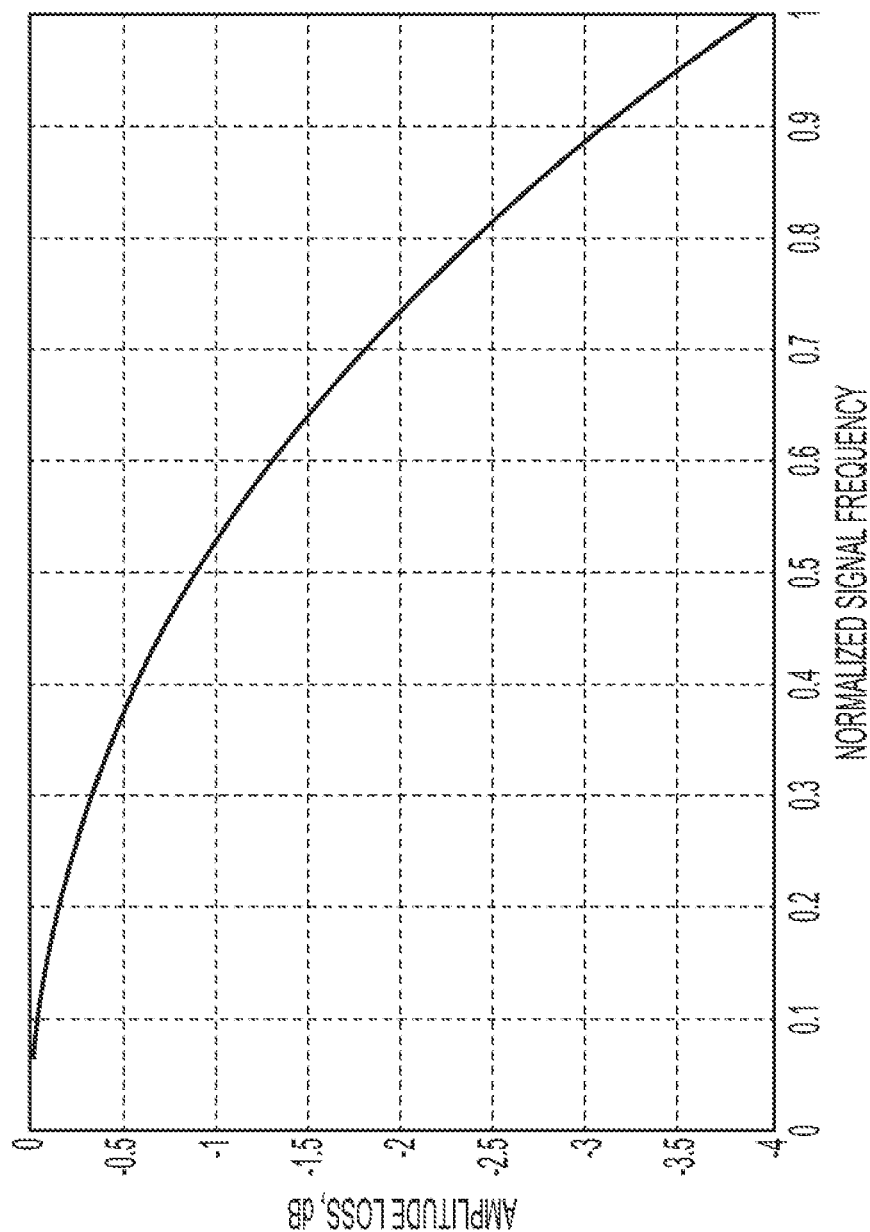
FIG. 3 shows the signal loss because of imperfect averaging, depending on component frequency.
Figure 4:
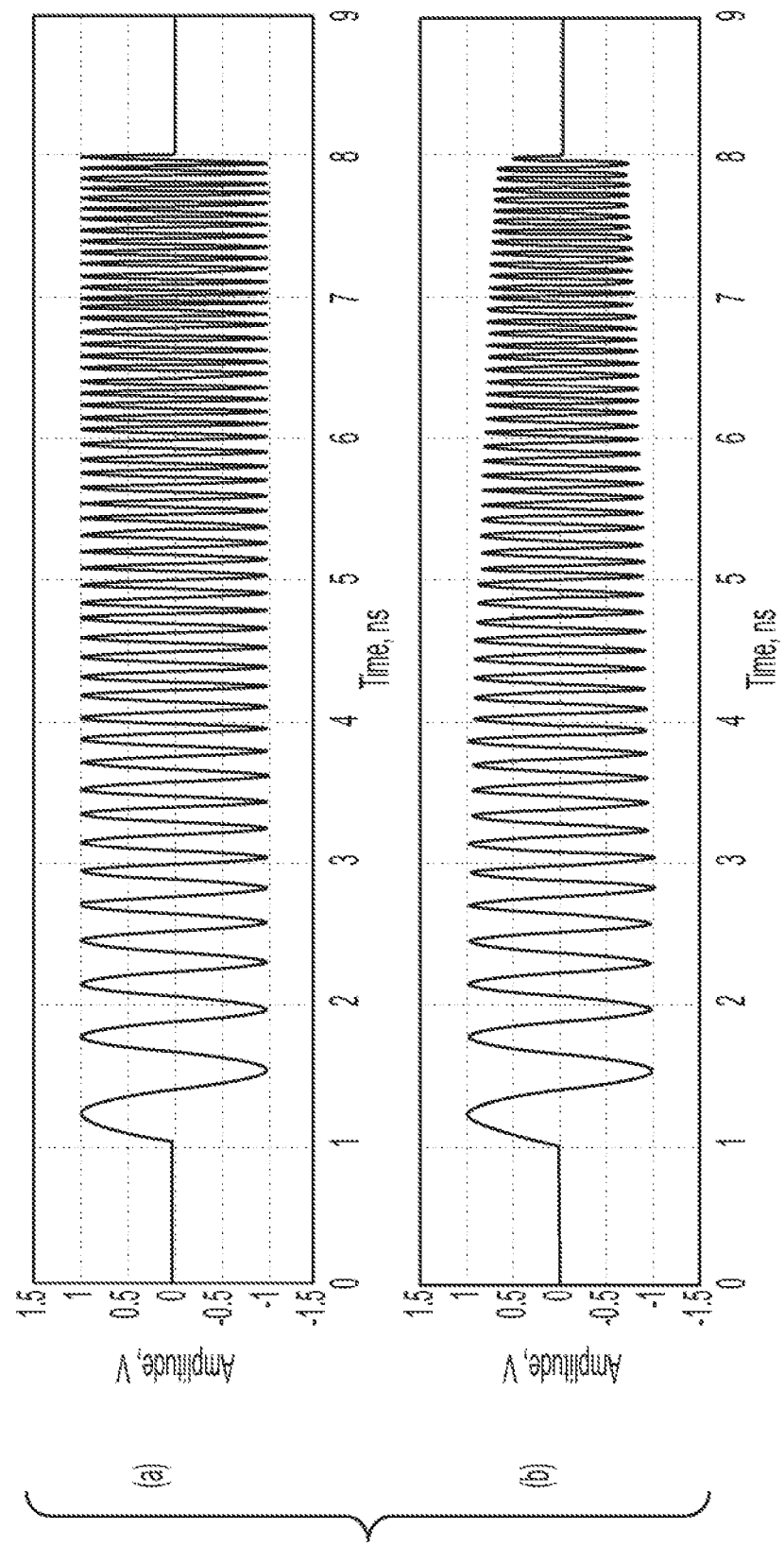
FIG. 4 shows an example of signal distortion caused by imperfect averaging.
Figure 5:
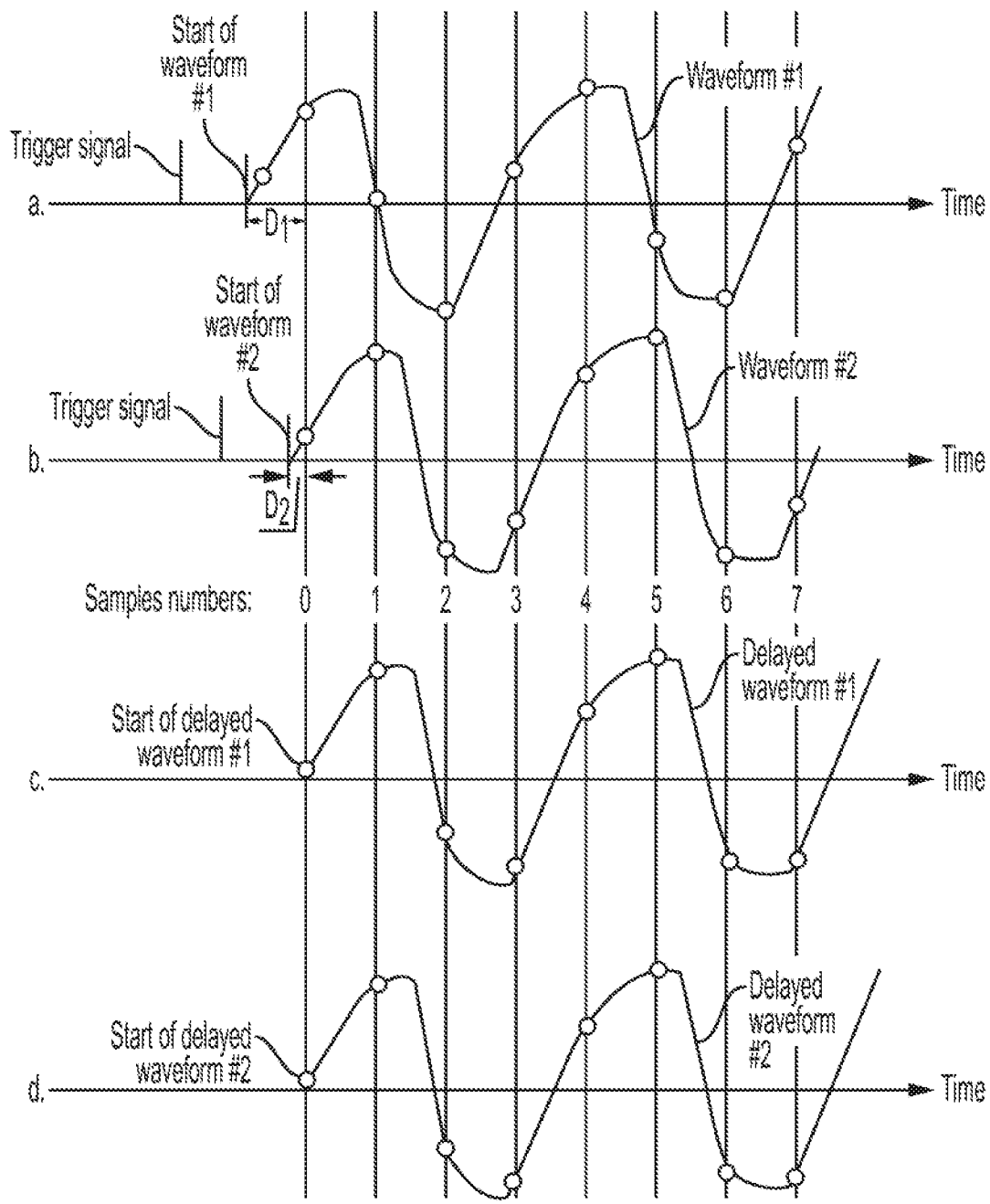
FIG. 5 illustrates the operation of controlled discreet time delay for an example of a waveform.

The operation of the controlled discreet time delay operation is illustrated along four time axes a, b, c and d in FIG. 5. A first waveform, waveform #1, and an associated trigger signal, are shown along axis a in FIG. 5. The start of the waveform #1, which is rigidly bound with its associated trigger signal, is pointed out along axis a in FIG. 5. The distance $D_1$ between the waveform start and the closest following sample, determines the mutual arrangement of the waveform and the sampling clock, as well as the set of digital samples produced by conversion from analog to digital form.

A second waveform, waveform #2 (similar to the waveform #1), is shown along axis b in FIG. 5. The position of waveform #2 in time differs from the position of waveform #1, so that the distance $D_2$ between its waveform start and the closest following sample, is different from the distance $D_1$. As a result, the conversion of the waveform #2 produces a set of digital samples which is different from the set shown along axis a in FIG. 5. The difference between the values of digital samples representing the similar waveforms, is the cause of the appearance of frequency components distortions if an attempt of averaging is performed directly after analog to digital conversion.

The operation of the discreet time delay by time interval $D_1$ applied to waveform #1, produces a delayed waveform #1, shown along axis c in FIG. 5. The start of the delayed waveform #1, which is shifted in relation to the start of the initial waveform by $D_1$, lands in the immediate vicinity of the following sample (i.e., the sample #0). The mutual position of the delayed waveform and the sampling clock unequivocally determines the values of the samples, transporting the waveform.

The operation of the discreet time delay by time interval $D_2$, applied to waveform #2, produces a delayed waveform #2, shown along axis d in FIG. 5. As it should be, the start of the delayed waveform #2 practically coincides with the following sample. The mutual position of the delayed waveform and the sampling clock along axis d in FIG. 5d exactly repeats the arrangement along axis c in FIG. 5, so that values of the produced samples along both axes c and d in FIG. 5 coincide (up to the differences caused by the noise present in the signal). The match of the values of the samples produced by the analog to digital conversion of the different delayed waveforms, explains why the operation of the discreet time delay before averaging eliminates the frequency components distortions in the resulting replicas of the waveforms.

An important result of the controlled discreet time delay operation is the fact that the start of the delayed waveform lies in the last section of the sampling period which immediately precedes the following sample. This fact is common to all delayed waveforms produced by the controlled discreet time delay operation. In the example illustrated along axis a of FIG. 5, the distance between the initial waveform start and the following sample is slightly less than the sampling period. After the controlled discreet time delay operation (illustrated along axis c of FIG. 5), the distance between the delayed start and the following sample is considerably reduced.

As mentioned above, the distance between the initial waveform start and the next sample is a random variable which lies in a range from zero to T. After the operation of the controlled discreet time delay, all starts of the delayed waveforms are clustered in a time interval of length T/K. Consequently, the time shifts of starts of waveforms in relation to the sampling clock, remain a random quantity within the range from zero to T/K. The reduction of starts time shift in K times provides the corresponding decrease in frequency distortions caused by averaging.

An estimation of residual distortions in the averaged signal may be obtained by the use of the equation (1). The greatest attenuation distortion $b_N$ at the Nyquist frequency $W_N=\pi/T$ may be calculated as $$b_N=20\cdot\log(\sin(\omega_N T/K/2)/(\omega_N T/K/2))=20\cdot\log(\sin(\pi/K/2)/(\pi/K/2)).$$

When K is chosen to equal 8, then $b_N$=0.0559 dB. When K equals 16, then $b_N$=0.0135 dB. This means that for all practical purposes, the controlled discreet time delay operation eliminates the frequency components distortions caused by averaging.

Figure 6:
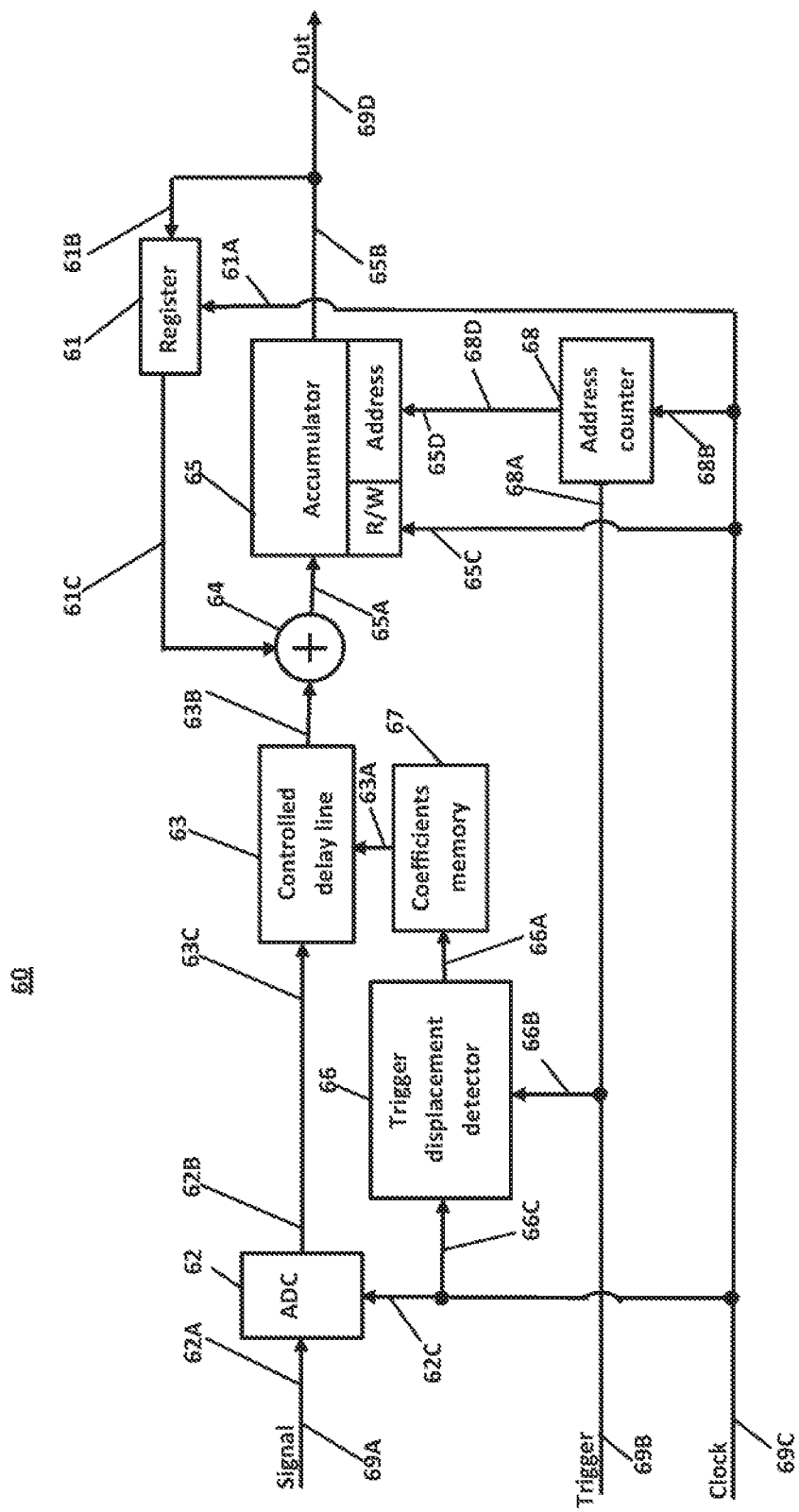
FIG. 6 shows a block diagram of an exemplary embodiment of the present disclosure.

A block diagram of an exemplary embodiment of an apparatus 60 deploying the controlled discreet time delay for averaging a sequence of repetitive waveforms, is shown in FIG. 6. In this block diagram, an apparatus signal input 69A is adapted to receive a sequence of analog repetitive waveforms to be averaged. This sequence of waveforms is applied to the input 62A of the ADC 62. The ADC 62 has also a clock input 62C, connected to a clock input 69C of the apparatus 60. The ADC 62 converts the applied sequence of analog waveforms into a stream of digital samples. The samples produced by ADC 62, appear at its output 62B, which is connected to the signal input 63C of a controlled delay line 63.

In the illustrated embodiment, the controlled delay line 63 is a FIR filter with a constant amplitude frequency response and a linearly growing phase frequency response $\phi(\omega)=D\cdot\omega$. The group delay D of the FIR is variable and may be changed by loading an associated set of coefficients into the FIR from a coefficients memory 67 through a control input 63A. The coefficients memory 67 is controlled by a signal coming from an output 66A of a time displacement detector 66. The time displacement detector 66 receives a trigger signal and sampling clock from inputs 66B and 66C, respectively, of apparatus 60, and produces at its output 66A, a signal representative of a number k which indicates a section [k·T/K, (k+1)·T/K] of the sampling period T where the trigger signal occurred. The time displacement detector 66 keeps the number k at its output all the time during the processing of a current waveform. The coefficients memory 67, receives at its input, the number k, and produces at its output, a set of coefficients which controls group delay of the controlled delay line 63 to be equal D=(K−1−k)·T/K.

Each waveform appearing in an input signal applied to signal input 69A, is converted by ADC 62 into a set of digital samples which, in effect, transport the waveform to a signal input 63C of the controlled delay line 63. The transformation of the sample values by the controlled delay line 63, shifts the waveform in relation to the samples by the delay D. As a result, the start of the waveform becomes shifted to the last section of the sampling period which immediately precedes the following sample. The concentration of waveform starts in the immediate vicinity of a sample reduces the start time shifts relative to the sampling clock and eliminates the cause of distortions which attend the averaging a sequence of repetitive waveforms.

The block diagram of FIG. 6 also comprises an accumulator 65, an address counter 68, a register 61 and an adder 64. The joint operation of these units provides averaging of the waveforms produced at an output 63B of controlled delay line 63.

The accumulator 65 is employed to save intermediate results of the waveforms averaging. Accumulator 65 constitutes a memory which includes a signal input 65A connected to an output of adder 64, a control read/write input 65C, an address input 65D, and an output 65B. When in a "write" mode, accumulator 65 saves a sample coming from adder 63, in a memory cell with an address equal to a number coming to an address input 65D. In a "read" mode, accumulator 65 produces at an output 65B, a value which has been kept in an addressed memory cell.

The "read"/"write" modes of the accumulator 65 are determined by a signal coming to the R/W input 65C from the clock input 69C of apparatus 60. In a first half of a sampling period, the clock signal sets the accumulator 65 to its "read" mode, while in the second half of a sampling period, the mode of accumulator 65 is changed to "write".

The number coming to the address input 65D of the accumulator 65, is generated by an address counter 68. The address counter 68 is reset to zero by each trigger signal coming to the reset input 68A from the apparatus trigger input 69B. The address counter 68 is advanced by the sampling clock coming to the counter clock input 68B from the clock input 69C of apparatus 60. In this way, the address counter 68 operates synchronously with ADC 62 and produces at its output 68D, a serial number n for a current sample produced by ADC 62. This serial number n indicates the position of the sample inside the digital representation of the waveform being processed.

During the acquisition of the input signal, ADC 62, at each sampling interval, produces a new sample. The address counter 68 sends to the address input 65D of accumulator 65, a number n of the current sample. In the first half of the sampling interval, the accumulator 65 produces at its output, the contents of the memory cell with the address n. This value is applied to a signal input 61B of register 61 and is written into the register 61 by the falling edge of the sampling clock applied to register clock input 61A. During the second half of the sampling interval, register 61 repeats at its output 61C, the value from the memory cell with the address n. Adder 64 adds up the sample which has been produced by ADC 61, and the value from output 61C of register 61. The resultant sum proceeds to the signal input 65A of accumulator 65 and is written to its memory by a "Write" command which is set at a R/W input 65C of accumulator 65 in the second half of the sampling interval. In this way, the sample produced by ADC 61 is added to the contents of the memory cell of accumulator 65 with the address n, with the sum being saved in the same memory cell.

At the beginning of the operation of apparatus 60, the contents of the accumulator 65 are reset to zero. Each waveform appearing at signal input 69A of apparatus 60, after being converted to the digital form by the ADC 62 and being aligned in relation to the samples by the controlled delay line 63, is added to the averaged replica of the waveforms accumulated at this time in accumulator 65.

The apparatus 60 further comprises a trigger signals counter (not shown in the FIG. 6). This trigger signals counter has an input connected to the trigger input of apparatus 60, and an output. At the start of operation of apparatus 60, the trigger signals counter is reset to zero and then is advanced by the subsequent trigger signals. When the value at the counter output reaches a specified number, it means that the sum of an equal number of waveforms has been accumulated. At this time, data acquisition stops and the accumulated sum is extracted, on a sample by sample basis, from the memory cells of accumulator 65 through an output 69D of apparatus 60, forming the resulting data stream.

The apparatus, comprising an ADC typically, but not necessarily, further includes an equalizer, adapted for reduction/correction of frequency and phase response mismatches of sub-ADCs within a time-interleaved form of ADC 62, which may be different from the ideal ones. In some cases, it is possible to combine this equalizer with the FIR used in the block diagram of FIG. 6 as a delay line to simplify the apparatus 60.

The above-described exemplary configuration of FIG. 6 is one of a number of possible embodiments of the present disclosure. For example, if the accumulator 65 in the configuration of FIG. 6 is built using a memory which performs writing to the cell and reading from the cell simultaneously (without division in time), then register 61 and the connection feeding the R/W input 65C of the accumulator (and the input itself), become unnecessary. The possible embodiments differ in features which are not of vital importance for fundamental operation of the disclosed apparatus. The common properties of these embodiments which are essential for the implementation of the present disclosure, are outlined in the following claims.

One skilled in the art will realize the subject disclosure may be embodied in other specific forms without departing from the spirit or essential characteristics thereof. The foregoing embodiments are therefore to be considered in all respects illustrative rather than limiting of the technology described herein. The scope of the subject disclosure is thus indicated by the appended claims, rather than by the foregoing description, and all changes that come within the meaning and range of equivalency of the claims are therefore intended to be embraced therein.

What is claimed is:

1. A method of noise suppression by averaging repetitive waveforms comprising the steps of:
   A. converting an applied succession of repetitive analog waveforms into a corresponding succession of streams of digital samples;
   B. analyzing mutual dispositions of trigger signals marking starts of the respective waveforms of the applied succession of waveforms, and a periodic sampling clock characterized by a period T, to determine a number k, where $0 \leq k < K$, indicative of an associated section $[k \cdot T/K, (k-1) \cdot T/K]$ of a sampling period in which the trigger signal appeared;
   C. shifting in time the samples streams created in the analog to digital conversion, wherein the shift in time is in relation to the position of the respective samples of the samples streams is by an amount equal to D, where $D=(K-1-k)\cdot T/K$;
   D. numbering the samples in the shifted samples streams in the order of their appearance, by a number n, beginning with n=0 for a sample immediately following a trigger signal;
   E. saving intermediate results of the waveform processing in a multi-cell memory, wherein the cells of the memory are reset the to zero at the start of a measurement interval, and each appearing sample of the shifted samples streams is added to contents of the memory cell with an address n;
   F. calculating a number of waveforms which have been processed during the measurement interval, by counting the trigger signals occurring during the measurement interval; and
   G. following an end of the measurement interval, extracting the contents of the memory on a sample by sample basis, and when the number of waveforms which have been processed reaches a predetermined number, forming a resultant averaged replica of the processed waveforms.

2. An apparatus for noise suppression by averaging repetitive waveforms, comprising:
   A. an analog to digital converter (ADC) including:
      a. an ADC signal input adapted to receive an applied succession of repetitive analog waveforms,
      b. an ADC clock input adapted to receive an applied periodic clock signal characterized by a sampling period T, and
      c. an ADC output,
      wherein the ADC is adapted to convert successive repetitive analog waveforms applied to the ADC signal input into a corresponding succession of streams of digital samples which are applied to the ADC output;
   B. a time displacement detector (TDD) including:
      a. a trigger input adapted to receive an applied trigger signal comprising trigger components, wherein the trigger components are representative of respective starts of the repetitive analog waveforms of the applied succession of analog waveforms,
b. a clock input adapted to receive an applied clock signal characterized by sampling period T, and
c. a TDD output,
wherein the time displacement detector is responsive to an applied trigger signal to produce at the TDD output, a number k, where 0≤k<K, indicating an associated section [k·T/K, (k+1)·T/K] of the sampling period T where a respective trigger signal occurred, and keeps this number unchanged up to an appearance of a next trigger signal;

C. a controlled delay line (CDL) including:
 a. a CDL signal input connected to the ADC output, and adapted to receive the succession of streams of digital samples,
 b. a CDL control input and
 c. a CDL output,
 wherein the controlled delay line is characterized by a substantially uniform amplitude frequency response and a variable group delay D controlled by a set of coefficients loaded by way of the CDL control input, whereby the controlled delay line is adapted to shift the waveforms represented by the sample streams by the group delay D;

D. a coefficients memory (CM) including:
 a. a CM input connected to the output of a trigger displacement detector, and
 b. a CM output connected to the control input of the controlled delay line,
 wherein the coefficients memory is adapted to:
  i. receive from the trigger displacement detector by way of the CM input, a number k, and
  ii. produce at the CM output, a set of coefficients which predetermine the delay of the controlled delay line to be D=(K−1−k)·T/K, E. an adder including:
 a. a first adder input connected to the CDL output of the controlled delay line, and adapted to receive the sample stream as delayed by the controlled delay line,
 b. a second adder input connected to a register output, and adapted to receive samples representative of earlier stored sample streams values,
 c. an adder output,
 wherein the adder is adapted to sum the samples applied to the first adder input and second adder input, and place the result at the adder output;

F. an accumulator including:
 a. a plurality of memory cells,
 b. an accumulator signal input connected to the adder output,
 c. an address input, and
 d. an address output,
 wherein a value produced at the address output is transmitted directly or otherwise to the second adder input, wherein the accumulator is adapted to read the contents of the accumulator cell with the address applied to its address input, and to write the value, coming to its signal input, into the same cell;

G. an address counter including:
 a. an address clock input connected to the clock input, and adapted to receive the received clock signal,
 b. a reset input connected to the trigger input, and adapted to receive the received trigger signal, and
 c. an output connected to the address input of the accumulator,
 wherein the address counter is incremented by each clock signal received, and reset to zero by each received trigger signal, and H. a trigger signals counter (TSC) including:
 a. a TSC input coupled to the trigger input, and
 b. a TSC output,
 wherein the trigger signals counter is reset to a first reference value at commencement of a measurement interval, and incremented thereafter during the measurement interval by each trigger signal received until a second reference value is reached, and thereafter provides reading of the accumulator contents, forming at the apparatus output, succession of resultant averaged waveforms.

3. An apparatus for noise suppression by averaging repetitive waveforms, according to claim 2, wherein the ADC is a time interleaved ADC including a plurality of sub-ADCs connected in parallel, where in the frequency and phase responses of the sub-ADCs are mismatched, and the controlled delay line is combined with an equalizer adapted to reduce the ADC frequency and phase response mismatches.

* * * * *